United States Patent [19]
Keller et al.

[11] Patent Number: 5,431,737
[45] Date of Patent: Jul. 11, 1995

[54] INTERCHANGEABLE CVD CHUCK SURFACE

[75] Inventors: Ernest Keller, Sonny Vale; Frederick J. Scholz, Fremont, both of Calif.

[73] Assignee: Genus, Inc., Sunnyvale, Calif.

[21] Appl. No.: 830,603

[22] Filed: Feb. 4, 1992

[51] Int. Cl.⁶ ............................................. C23C 16/00
[52] U.S. Cl. ................................... 118/729; 118/728; 118/500; 118/503
[58] Field of Search ................ 118/728, 729, 500, 503

[56] References Cited

U.S. PATENT DOCUMENTS

| | | | |
|---|---|---|---|
| 5,044,943 | 9/1991 | Bowman | 118/500 |
| 5,160,544 | 11/1992 | Garg | 118/728 |

*Primary Examiner*—Richard Bueker
*Attorney, Agent, or Firm*—Donald R. Boys

[57] ABSTRACT

A chuck in a coating chamber in a CVD system has a hearth for providing heat to a substrate and an interchangeable chuck surface mounted on the hearth for supporting a substrate to be coated during processing. In preferred embodiment there are a plurality of chucks in a system. Excessive coating on surfaces in the CVD chamber other than substrate surfaces to be coated is substantially removed periodically by venting the chamber and replacing the interchangeable chuck faces. Also in a preferred embodiment, an interlocking feature operable by temperature is provided to secure the chuck faces during operation and to release them for interchanging. Also in a preferred embodiment heat transfer between the hearth and the chuck is enhanced by rings and grooves that increase surface area for heat transfer.

20 Claims, 8 Drawing Sheets

| D1 | 249.17 | D17 | 38.10 |
|---|---|---|---|
| D2 | 160.91 | D18 | 25.40 |
| D3 | 238.33 | D19 | 228.60 |
| D4 | 238.58 | D20 | 25.91 |
| D5 | 0.51 | D21 | 37.34 |
| D6 | 114.30 | D22 | 51.31 |
| D7 | 114.05 | D23 | 62.74 |
| D8 | 240.87 | D24 | 76.71 |
| D9 | 227.58 | D25 | 88.14 |
| D10 | 139.70 | D26 | 102.11 |
| D11 | 127.00 | D27 | 127.51 |
| D12 | 101.60 | D28 | 138.79 |
| D13 | 88.90 | D29 | 4.70 |
| D14 | 76.20 | D30 | 5.59 |
| D15 | 63.50 | D31 | 3.81 |
| D16 | 50.80 | D32 | 8.51 |

Dimensions in mm.

Fig. 6

INTERCHANGEABLE CVD CHUCK SURFACE

FIELD OF THE INVENTION

The present invention is in the area of equipment for performing chemical vapor deposition (CVD) processes, and relates more particularly to equipment for holding and heating wafers for such processes.

BACKGROUND OF THE INVENTION

Manufacturing of integrated circuits is generally a procedure of forming thin films and layers of various materials on wafers of base semiconductor material, and selectively removing areas of such films to provide structures and circuitry. Doped silicon is a typical base wafer material. CVD is a well known process for depositing such thin films and layers. For example, polysilicon may be deposited from silane gas, $SiH_4$. It is known, too, to deposit tungsten silicide from a mixture of gases including silane and a tungsten-bearing gas such as tungsten hexaflouride. Pure tungsten is also deposited on silicon wafers in the manufacture of integrated circuits, sometimes selectively and sometimes across the entire surface in a process known as "blanket" tungsten.

In a typical CVD process wafers are placed on supports within a sealable chamber, the chamber is sealed and evacuated, the wafers are heated, typically by heating the wafer support, and a gas mixture is introduced into the chamber. For example, in the blanket tungsten process, tungsten hexaflouride and hydrogen are introduced as reactive gases and argon may be introduced as a non-reactive carrier gas. The tungsten hexaflouride is the source of deposited tungsten. Typically the gases are flowed continuously during processing. The temperature of a substrate (wafer) to be coated is one of the variables that drives the chemical reaction to cause tungsten to be deposited on the wafer surface. It is important to control the temperature, the concentration of various gases in the mixture introduced, and such characteristics as the uniformity of flow of gas over the surface being coated, among other variables. An even thickness of a deposited layer is an important characteristic.

A common arrangement in a CVD processing apparatus is to place a wafer against a flat surface, such as a surface on a central turret in a chamber that can be evacuated and into which CVD gases may be introduced. The turret is heated to heat the wafer. It is also known to support a wafer on a CVD chuck separate from but attached to a central turret, and to heat the chuck to heat the wafer. This arrangement allows for a lower thermal mass for the chuck and consequently a quicker response time when it is necessary to change the temperature.

A relatively common arrangement in CVD processing is to provide several heatable chucks connected to a central turret within a sealable chamber that may be evacuated, and to which processing gases may be introduced. Wafers are placed on the chucks, the chamber is sealed and evacuated, and process gases are introduced. Deposition takes place on the exposed surface of the wafers on the chucks from heat-precipitated chemical reaction, the deposited material being contributed by one of the gases introduced into the sealed chamber.

In apparatus like that described above, it is now common to transfer wafers to and from the CVD processing chamber through vacuum load and unload locks, which allows the processing chamber to remain under vacuum through the processing of several "batches" of wafers, a "batch" being typically equal to the number of chucks available for wafer support in the processing chamber.

Allowing the processing chamber to remain in a relative vacuum rather than being exposed to air has a distinct advantage in that the process conditions may be re-established relatively quickly after one batch of coated wafers is unloaded and another batch of wafers to be coated is loaded to the chucks.

One reason exposure to air can be detrimental is that the gas constituents in air may contaminate the chamber between processing cycles. Oxygen may be particularly troublesome in some processes. Another reason is that air molecules tend to adhere to surfaces, to be absorbed in materials within the chamber, and to become trapped in remote regions like screw threads. Vacuum pumpdown after exposure to air is a relatively long process compared to re-establishing process conditions in a chamber that has not been exposed to air. Use of load and unload air locks, allowing the chamber to remain under vacuum during wafer unload and load operations, allows higher throughput of processed parts, hence greater return on investment.

Still, there are definite limits to the number of batches that can be processed before an air-locked chamber is exposed to air. One reason is that not all the deposition is on the exposed surface of the wafer. The coating material is typically deposited on all surfaces in the CVD chamber that are at a sufficient temperature to precipitate the deposition. Although an effort is made to minimize heated surfaces in the chamber by providing heated chucks, it is typically not feasible to heat only the wafer. Material deposits on the chuck surfaces away from the wafer.

The processed wafers are removed after a batch run, and uncoated wafers are loaded to the chucks. The chucks, however, undergo an accumulative deposition. After a certain amount of accumulation of material, depending on such things as the material deposited, the material of the chuck, temperature variations for the apparatus, and other variables, the accumulation of material on exposed chuck surfaces may begin to peel and flake. If peeling and flaking occurs, the resulting particles can be very detrimental to the substrates (wafers) being coated and to operation of Precision equipment. Particles are particularly troublesome if they form at or very close to a wafer in process, because then they are more likely to adhere to the wafer or to become incorporated in a film being deposited on the wafer.

A typical procedure to combat formation of particulates due to coating buildup is to periodically vent the chamber and clean accumulated deposits from the surfaces in the chamber. A cleaning operation typically requires a subsequent long period of pumpdown and reconditioning to bring the process chamber back to operating condition.

It is also known to plasma etch the chamber to remove offending material accumulation before it becomes a source of generated particles, but this procedure has its own set of difficulties. Besides requiring introduction of etching species (gas), which may be contaminating to subsequent processing cycles, expensive plasma generating apparatus is also needed. There is also the time involved in performing the plasma etch operations, and the problem of ascertaining when the cleaning is finished. Moreover, plasma cleaning often has an effect of removing material from one area but depositing it on another.

Another problem common to most CVD operations in the manufacture of ICs is contamination. One group of contaminants of concern is the column of elements in the periodic table that includes chlorine and fluorine. These elements are in general very mobile, even in solids, and very chemically reactive. Chlorine and fluorine are particular problems, because these elements are present in some of the gases commonly used for providing material to be deposited. For example, flourine is a constituent of $WF_6$, which is the most common process gas used to supply tungsten to make tungsten films in CVD processing. Other gases provide chlorine, such as dichlorosilane, a gas sometimes used in processes requiring silicon.

Besides being primary contaminants, gases like chlorine and flourine are known to react with chuck materials and to "leach" material from the chuck. One of the more popular chuck materials is Monel metal, which has copper as a constituent. Chlorine in particular is known to be a problem with monel, causing contamination of wafers with copper.

The inventors have experimented with interchangeable chuck faces to combat the above problems, and encountered considerable difficulty. One problem is that a chuck face that is not an integral part of the chuck has to come to a surface temperature sufficient to bring the wafer that it supports to processing temperature. The extra physical interface means that the chuck itself has to be hotter than before. Accomplishing the purpose without overheating and damaging the chuck is a particular problem.

In attempting to lessen the affect of the extra interface it has been found that fastening the removable face securely to the chuck, such as with conventional screw fasteners, is helpful for heat transfer, but detrimental in that the expansion characteristics, if the materials are different, often causes damage. Fastening also presents a problem of removal and remounting when it is time to service the system by replacing the chuck faces.

What is clearly needed to combat these problems is a system of interchangeable chuck faces made of a material that eliminates the leaching phenomenon, and allows quick change. Interchangeable faces also need to be fabricated and mounted in a way that the face temperature to heat the wafer is adequate while avoiding overheating of the chuck itself. In addition, fasteners must be avoided to provide the quickest change and to eliminate breakage and damage due to expansion and contraction. The faces still need to be secure to the chucks in operation.

SUMMARY OF THE INVENTION

In a preferred embodiment of the invention a chuck for supporting and heating a substrate during CVD processing in a CVD chamber comprises a hearth for providing heat energy to the substrate. The hearth is positioned within the CVD chamber and has a mounting surface and a heating element for providing heat energy. The chuck also comprises a chuck face for providing an interchangeable surface on the chuck. The chuck face has a front surface for supporting the substrate and a back surface mountable to the mounting surface of the hearth, and heatable by the hearth.

The chuck according to the present invention allows the chuck faces to be quickly and simply interchanged in a service procedure, with clean chucks exchanged for coated ones. This minimizes the need to physically, chemically, or plasma clean the chucks in the machine and maximizes production time. Moreover, by providing the chuck faces to be releasable at a temperature high enough to avoid peeling and flaking of coating, particles may be substantially avoided.

The chuck face according to the invention has, in a preferred embodiment, an interlocking feature that utilizes increase in temperature to securely lock the chuck face in place on the hearth and decrease in temperature to release it again for interchange. In one embodiment this is done by a Rim Lock feature having a rim that expands into a radial groove with increase in temperature. The temperature at which locking occurs is controllable by controlling the dimensions of the ring and groove according to the expansion coefficients of the materials used for the hearth and the chuck face.

Also in a preferred embodiment, to assure that the hearth does not exceed safe temperature while bringing a substrate to operating temperature, heat transfer enhancement features provide for minimizing the temperature difference between the heating means and the substrate.

BRIEF DESCRIPTION OF THE DRAWINGS

FIG. 6 is a table of dimensions referred to FIG. 5.

DESCRIPTION OF THE PREFERRED EMBODIMENTS

Figure 1A:
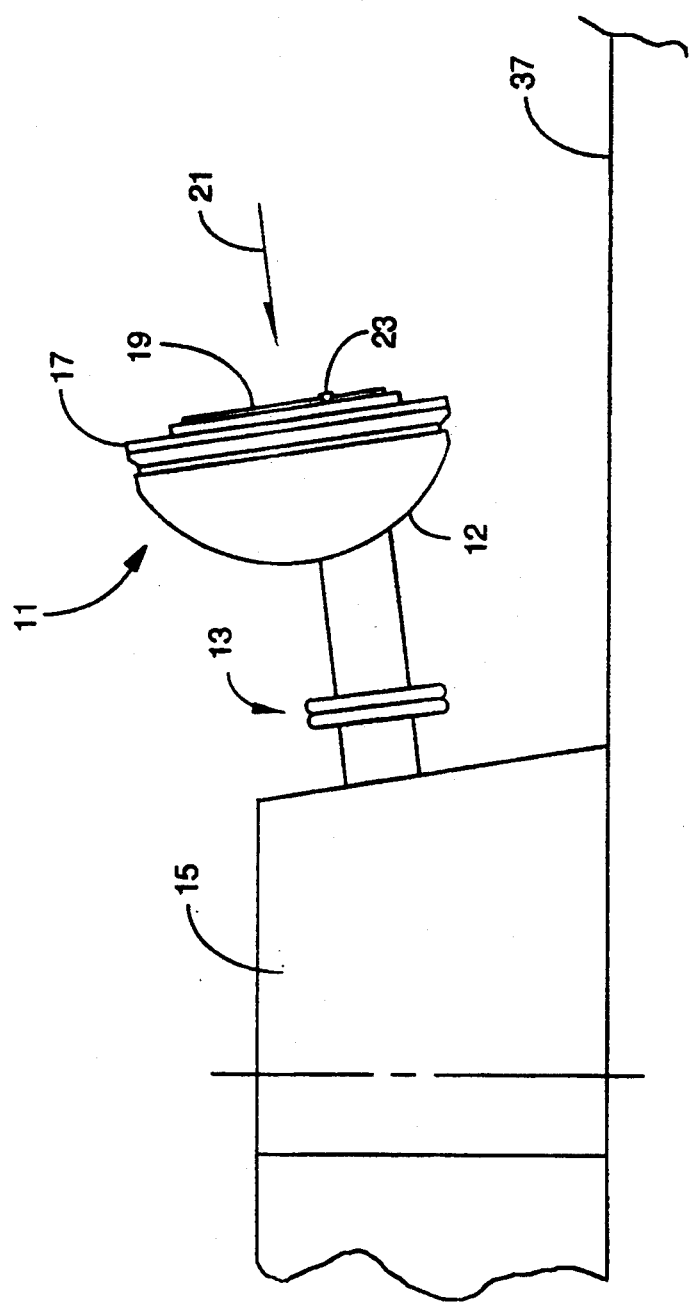
FIG. 1A is an elevation view of a chuck with a chuck face according to the present invention.
Figure 1B:
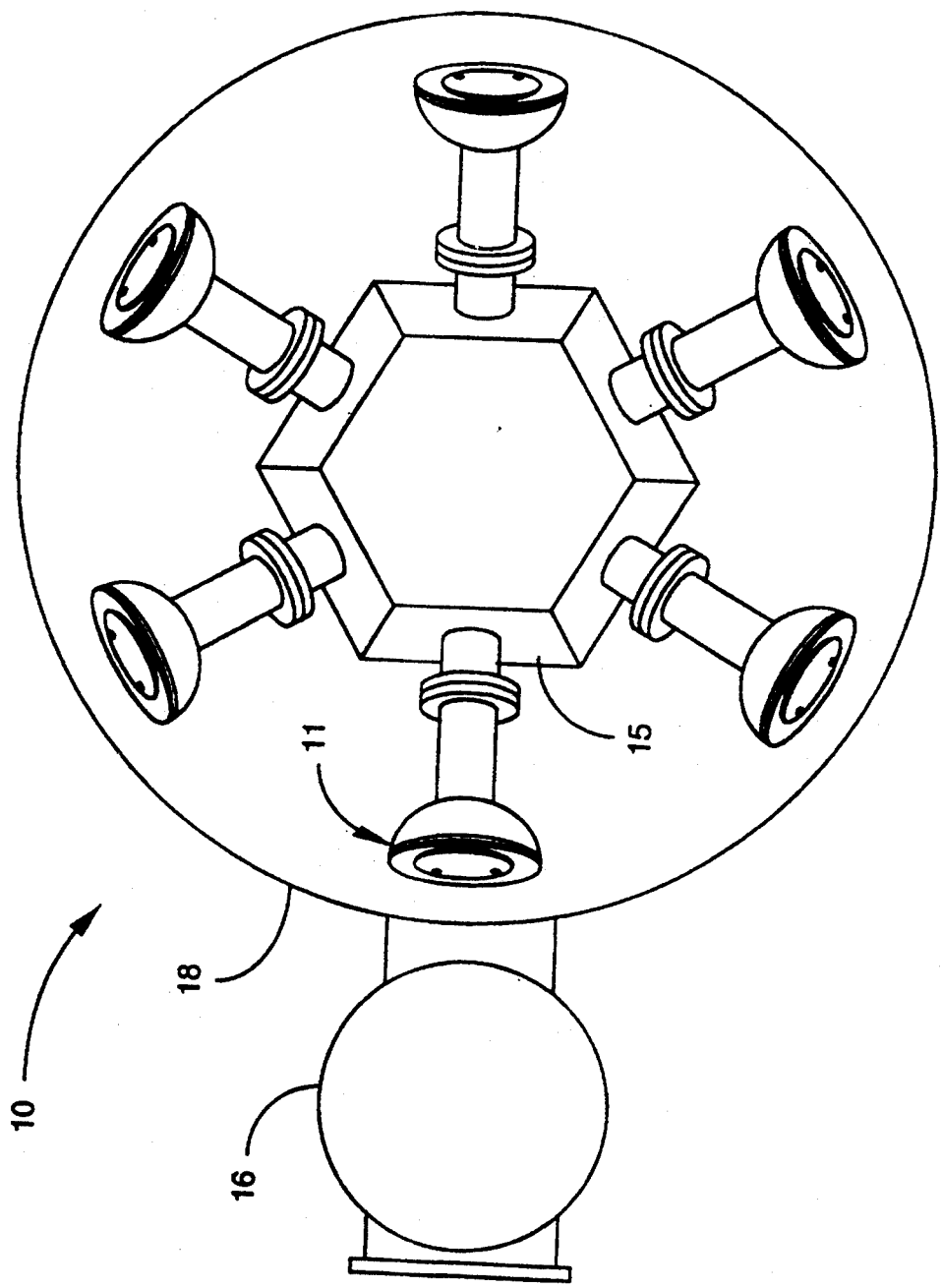
FIG. 1B is a plan view of a system according to the present invention having six chucks mounted to a central turret.

FIG. 1A shows a chuck 11 according to the present invention. Chuck 11 has a heatable hearth 12 mounted by a flange interface 13 to a central turret 15, and a removable chuck face 17 made of graphite. A wafer 19 is supported on pins extending from chuck face 17. One pin 23 is shown in FIG. 1A Chuck 11 is preferably one of several chucks assembled to turret 15, generally in a pattern around the periphery of the turret, and the turret is rotatable within a sealable CVD chamber. FIG. 1B is a plan view of a system 10 according to the present invention with chuck 11 mounted to a generally hexagonal central turret 15 along with five other similar chucks in a CVD chamber 18. In a preferred embodiment the CVD chamber is served by at least one vacuum load and unload lock 16 which is evacuated by a separate vacuum system (not shown), to allow wafers to be loaded to be processed without the necessity of venting the CVD chamber and exposing it to air.

Figure 2B:
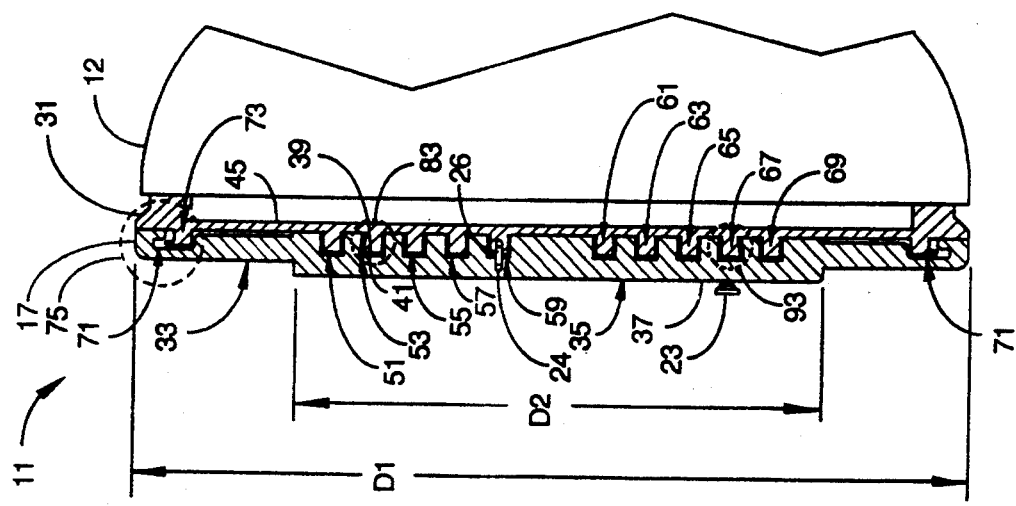
FIG. 2B is a section view of chuck face 17 and a portion of hearth 12 taken along section line 2B—2B of FIG. 2A.
Figure 2A:
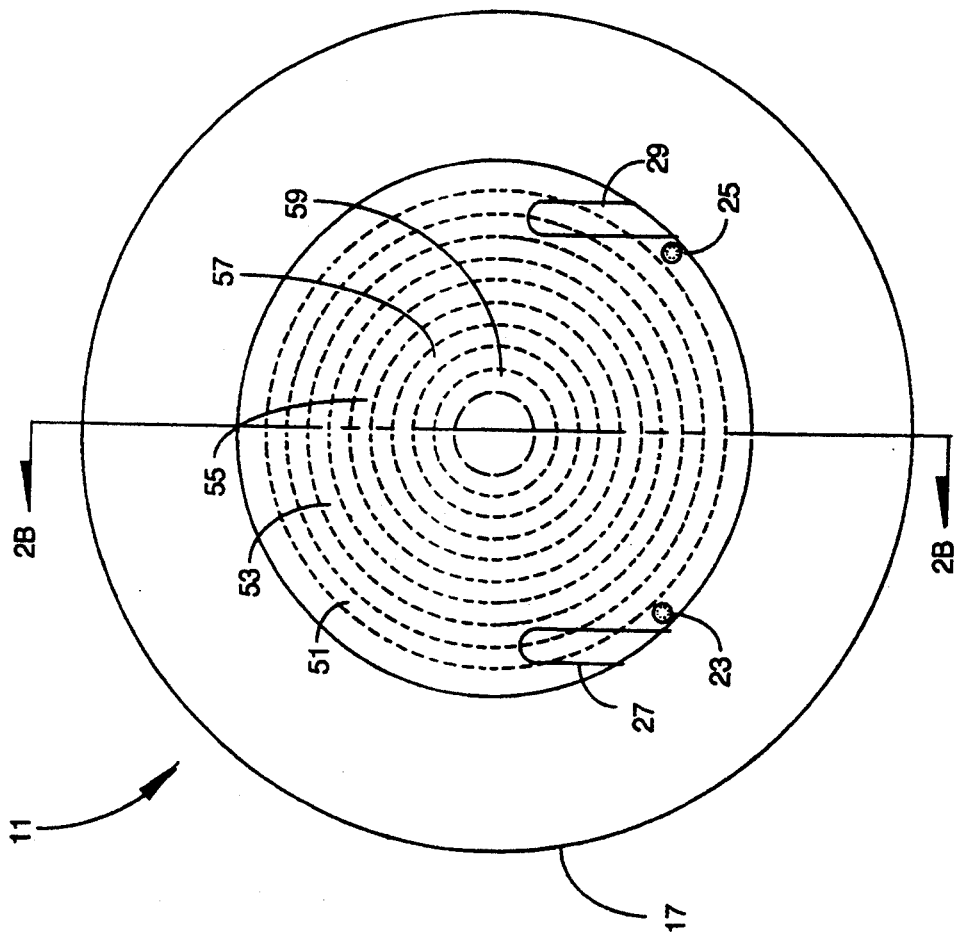
FIG. 2A is a front elevation view of a chuck according to the present invention with a chuck face in place.

FIG. 2A is a front elevation view of chuck 11 with chuck face 17 in place, but with wafer 19 removed. The view is in the direction of arrow 21 of FIG. 1A. Support Dins 23 and 25 are separate elements assembled into holes in the graphite chuck face, and grooves 27 and 29 are shallow clearance grooves to accommodate a robotic "wand" (not shown) used to transfer wafers to the chuck face and to remove processed wafers from the chuck face.

FIG. 2B is a section view of chuck face 17 and a portion of hearth 12 taken along section line 2B—2B of FIG. 2A. Chuck face 17 has an "apron" portion 33 and a central raised portion 35 in this embodiment Surface 37 of portion 35 opposite the hearth is the "front" surface upon which a wafer is supported for processing. Pins 23 and 25 for supporting a wafer are extended from front surface 37, and grooves 27 and 29 are machined in this surface as well. In this embodiment overall diameter D1 is about 250 mm. and the diameter D2 of portion 35 is about 160 mm. The embodiment described herein is provided for processing silicon wafers of nominal 150 mm. diameter, known in the art as 6-inch wafers. It will be apparent to one with skill in the art that dimensions may be altered to accommodate wafers of other sizes, and that other sorts of substrates than wafers used in the manufacture of integrated circuits might also be processed on equipment designed according to the invention.

In the present embodiment hearth 12 is mounted to the central turret so surface 37 is inclined about five degrees from vertical in the direction that causes a wafer to be urged by gravity toward surface 37. This feature may also be accomplished in other ways, such as machining the plane of surface 37 at a small angle to vertical.

The circular area of surface 37 is about the same as the area of a wafer to be heated, and it is through the area of surface 37 that heat is preferably transferred to heat the wafer. It is desirable that surfaces other than the wafer itself and the surface behind the wafer be kept relatively cool with respect to the wafer temperature, so deposited material in the CVD process forms as much as possible on the wafer. To accomplish this purpose in the presently described embodiment, means are provided to enhance transfer of heat to portion 35, and to inhibit transfer of heat to the apron area 33.

As stated above in the Background section of this application, it is known to the inventors to fasten a chuck face securely to a hearth to promote intimate contact for efficient heat transfer. This method has been found to be less than satisfactory, as desirable chuck face materials, of which graphite is exemplary, have different coefficients of expansion relative to temperature than does the metal hearth, which is preferably fabricated of monel metal. With secure fastening, the hearth typically expands more than the chuck face, and damage to the chuck face results. Also, when it is necessary to clean the system, having the chuck farce securely fastened requires considerably more time and effort to exchange the used and coated faces for clean ones.

The heat generating device in a chuck of the sort, depicted herein is within the hearth, and arranged to heat the "front" plate of the hearth. This is plate 31 in FIG. 2B, which is typically securely sealed to the rest of the hearth, such as by welding, to eliminate possibility of contaminating leakage from within the hearth into the CVD chamber. Consequently, heat is to be transferred from surface 39 (FIG. 2B) of plate 31 to back surface 41 of chuck face 17, through the chuck face to front surface 37, and from surface 37 to a wafer resting against surface 37. Please note that surface 39 is meant to denote all of the surface area on the side of plate 31 facing the chuck face, and surface 41 is meant to denote all of the surface on the side of the chuck face facing the hearth.

Figure 3:
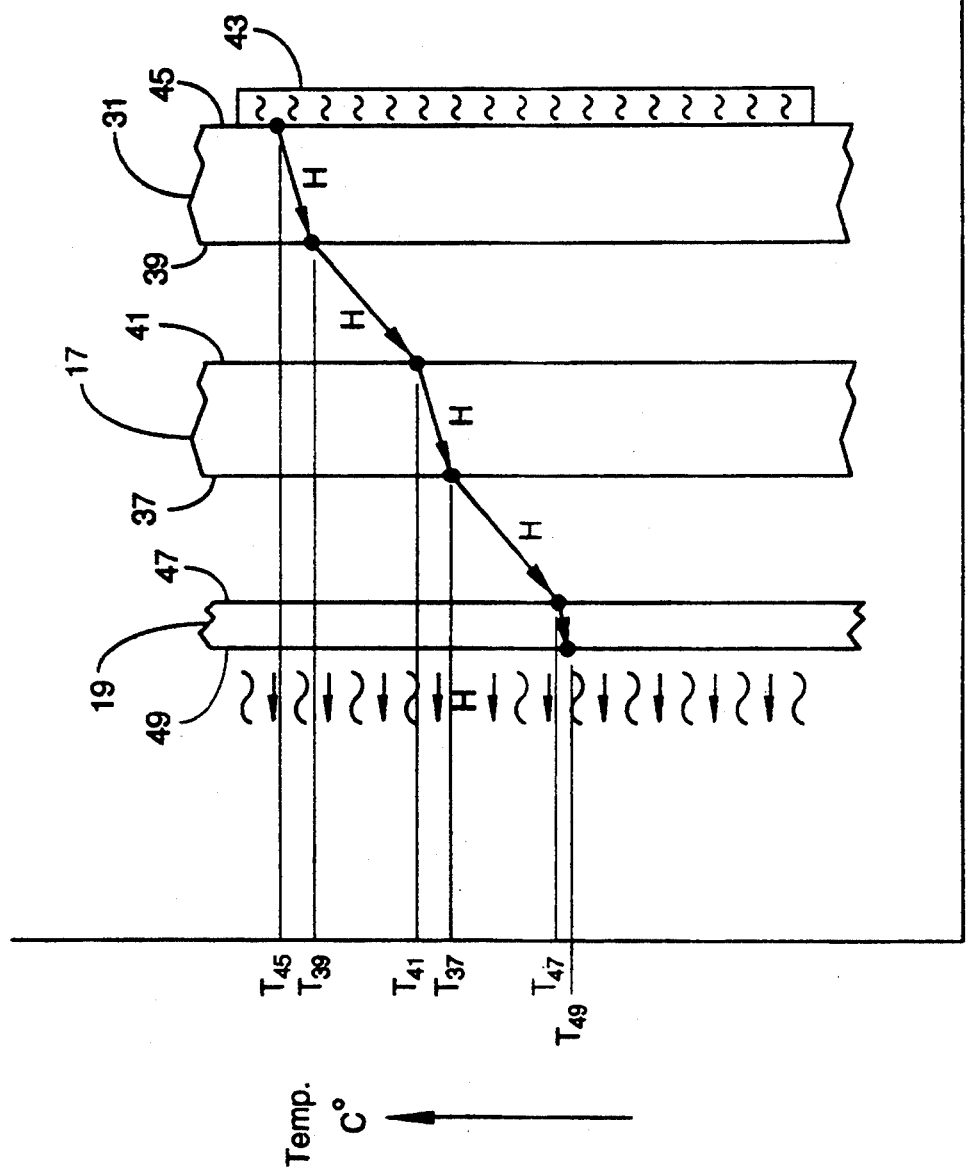
FIG. 3 is a diagram depicting flow of heat in an embodiment of the invention.

FIG. 3 is a diagram depicting flow of heat H from a neater 43 to the inside surface 45 of plate 31, through plate 31 to outside surface 39, from surface 39 to back surface 41 of chuck face 17, through chuck face 17 to surface 37 of portion 35 of chuck face 17, from surface 37 to back surface 47 of wafer 19, and from surface 47 to front surface 49 of wafer 19. This is the path of heat energy to heat front surface 49 of wafer 19 to a temperature required for a CVD process. The heater in the presently described embodiment is a copper plate with electrical resistance heating elements, and the plate is in intimate contact with surface 45. A typical temperature for a CVD process is on the order of 500 degrees C.

In FIG. 3, the heat flow path indicates the temperature of the elements in the path on a vertical scale, and the temperature at surfaces of interest is indicated on the scale as T with a subscript of the surface element number. It is very desirable to limit the overall temperature difference $T_{45}-T_{49}$ so the wafer may be brought to the needed process temperature while protecting the construction of the hearth from excessive temperature, which can have more than one detrimental effect. For example, a high hearth temperature can damage the hearth, and in lieu of damage, may cause excessive material buildup on surfaces other than the wafer to be coated, which leads to particulate formation and excessive downtime for cleaning.

As is known in the art of thermodynamics, heat energy flows from higher to lower temperature, so the trend in the general path of heat flow shown in FIG. 3 is from higher temperature to lower temperature. In the general diagram of FIG. 3, the H symbol for heat is not meant to represent a specific quantity or rate of heat flow, as there are losses in the general path, and the transfer rates are not the same from point to point. The diagram is meant to depict the steady-state heat flow in process.

Generally speaking, some heat supplied by heating device 43 to surface 45 is lost to surrounding parts of the hearth by conduction, transferred to other elements (not shown) in the chamber, and radiated away from the hearth to cooler surfaces in the chamber. Heat energy is also transferred by conduction through the thickness of plate 31 to surface 39. The temperature attained by surface 39 in the steady state, depends on, among other things, the amount of heat generated by device 43, the heat losses mentioned above, the coefficient of heat transfer by conduction for the material of plate 31, and the rate at which heat is transferred away from surface 39.

Heat transfer between surface 39 of plate 31 and surface 41 of chuck face 17 is by a combination of mechanisms. These include radiation, convection, conduction through gas phase species between the surfaces, and conduction by direct contact. The two surfaces are shown as separated in FIG. 3 because, although there is a certain amount of direct contact (see FIG. 2B), the chuck face is not urged against surface 39 of the hearth.

To minimize the temperature difference $T_{45}$-$T_{49}$ it is helpful to minimize the difference between any two surfaces in the heat flow path, and the interface between surfaces 39 and 41 provides such an opportunity. One variable in the heat transfer between these two surfaces important to all of the mechanisms of heat transfer mentioned above is the surface area of each of the surfaces. Another is the intimacy of contact between the surfaces.

Accordingly, in the presently described preferred embodiment of the invention, a series of five grooves 51, 53, 55, 57, and 59 (see FIG. 2A and FIG. 2B) is machined into the back of chuck face 17, effectively increasing the surface area of surface 41. A matching set of circular rings 61, 63, 65, 67, and 69 is machined into the front of plate 31, effectively increasing the surface area of surface 39. The increase in surface area afforded to surfaces 39 and 41 by the grooves and rings provided is sufficient to provide $T_{49}$ high enough to perform many processes without exceeding a hearth temperature of about 650 degrees C. In other embodiments requiring a relatively low wafer temperature, adequate heat transfer may be accomplished without the need for heat transfer enhancement.

In the preferred embodiment the hearth material is monel metal and the chuck face material is graphite. Graphite is a relatively fragile material with a low tensile strength. The grooves, when used, must be machined so the adjacent areas of grooves and ring projections are in close proximity to maximize efficiency of heat transfer, and the chuck face and the hearth must mate without interference at "room" temperature and at the temperature at which exchanges of chuck faces are to be made. The exchange is made for some embodiments of the invention at "room" temperature, that is, with the chucks completely cooled, and in other embodiments at a higher temperature.

Also, at operating temperature during CVD processing, it is important that there be no interference between the rings and grooves, because interference may well lead to fracture of the graphite material of chuck face 17. Accordingly, the groove and ring diameters are selected to minimize clearance, but to assure that there is no interference between the surfaces in the temperature range from ambient "room" temperature, about 20 degrees C., to operating temperature for the hearth, which may be as high as 650 C., and might in the future be even higher.

As described above, it is important in the invention that the chuck face can be assembled to the hearth without interference when it is needed to remove used faces and install unused ones. It is also important that at operating temperature the chuck faces stay in place on the hearths, and that there is no tendency to dislodge them from the mounted position. Accordingly there are, in the preferred embodiment, grooves and rings of unique design. Groove 71 in the chuck face, at the outer periphery of surface 39, has a unique design that allows the hearth, by virtue of a unique ring 73, to capture and hold the chuck face when the hearth is heated. Groove 71 and ring 73 in the invention are known as the Rim Lock.

Groove 53 and mating ring 67 also has a unique design to allow freedom of assembly for the chuck face at some selected temperature for service, but captures the chuck face and helps to prevent dislodging or distortion at operating temperature.

Figure 4B:
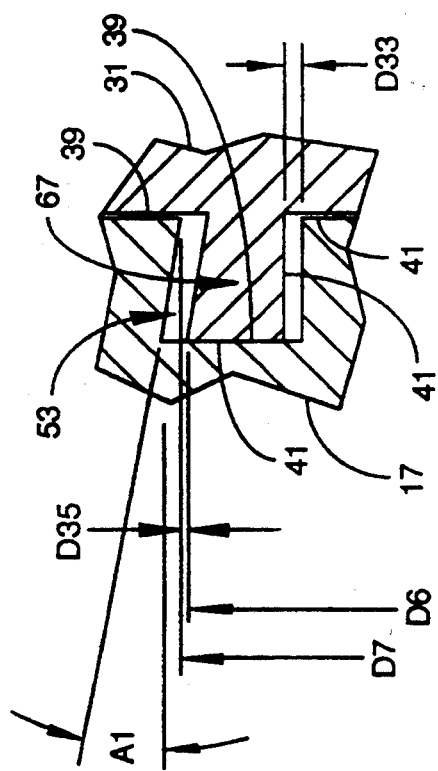
FIG. 4B is a magnified view of a portion of FIG. 2B showing an alternative locking groove and ring.
Figure 4C:
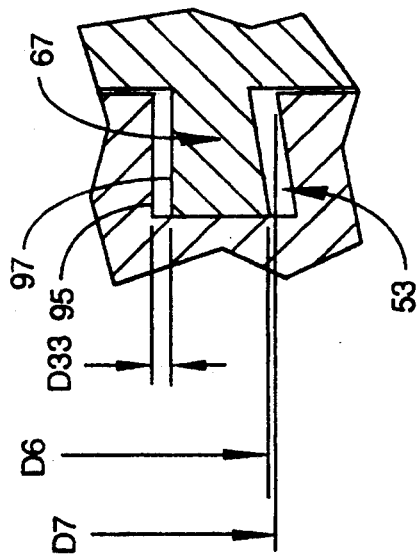
FIG. 4C is a magnified view of the same ring and groove shown in FIG. 4B, but at a lower portion of the interface.
Figure 4A:
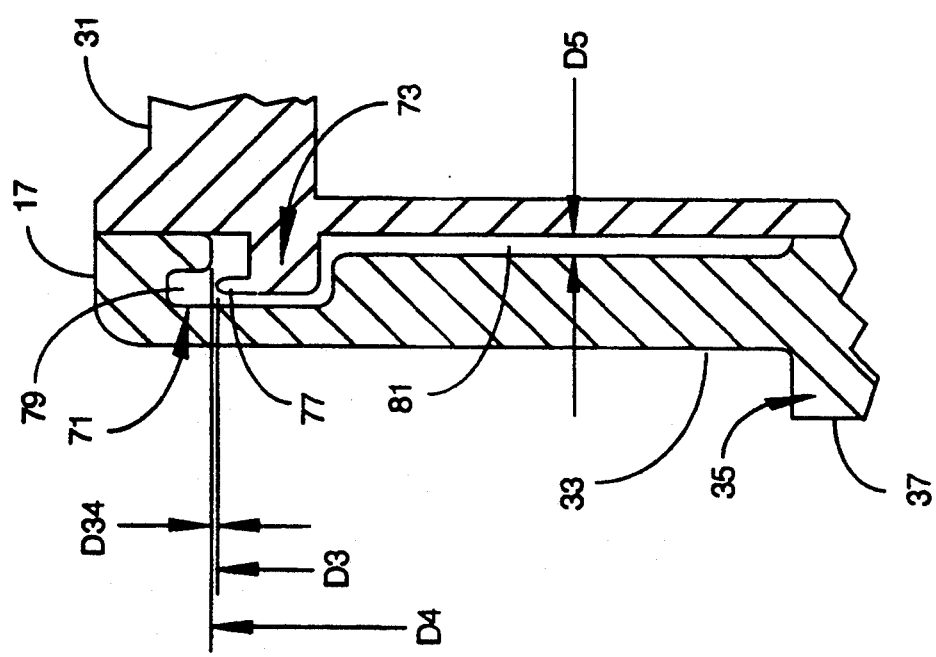
FIG. 4A is a magnified view of a portion of a Rim Lock groove ring shown also in FIG. 2B.

FIG. 4A is a magnified view of the section of Rim Lock groove 71 and ring 73 shown in dotted circle 75 in FIG. 2B. Diameter D4 on chuck face 17 and diameter D3 on plate 31 are machined in one embodiment so that D4-D3 at about 20 degrees C. (nominally "room" temperature) for the hearth is about 0.30 mm. (about 0.012 inches), so the radial clearance D34 is about 0.15 mm. (about 0.006 inches). At about 100 degrees C. for the hearth this difference is zero, and at temperatures above 100 degrees C. for the hearth, lid 77 protrudes into undercut 79 effectively locking chuck face 17 onto plate 31. In other embodiments other dimensions are used so the locking action takes place at different temperatures than 100 degrees C.

FIG. 4A is convenient to describe in further detail an alternative feature of the present invention which allows apron area 33 (FIG. 2B) to remain relatively cooler in operation than surface 37 upon which a wafer to be processed is supported. To accomplish this desirable effect an undercut 8 of depth D5 about 0.5 mm. is made separating the portion of the chuck face associated with apron area 33 from plate 31 by about that amount. This undercut has been found in practice to provide a temperature for apron area 33 considerably lower than the temperature of surface 37 upon which a wafer to be processed is supported.

FIG. 4B shows the part of section view FIG. 2B enclosed in dotted circle 83 of FIG. 2B, showing in cross section groove 53 and matching ring 67. This is the fourth groove and ring set from the center of chuck face 17 and front plate 31. FIG. 4C shows the part of section view FIG. 2B enclosed in dotted circle 93. This is the same ring and groove shown in FIG. 4B, but at the bottom of the interface rather than at the top as in FIG. 4B.

Groove 53 has a back angle A1 of about 3 degrees in the preferred embodiment, and ring 67 has a back angle as well. At about 20 degrees C. Diameters D7 and D6 are provided so D35 is about 0.15 mm. (about 0.006 inches). At about 100 degrees C. the difference is zero, and above 100 degrees C. D6 is larger than D7, so chuck face 17 may not be removed from front plate 31.

The Rim Lock, and in embodiments where used, the one groove with a back angle, prevent the chuck face from being dislodged in operation. There are possible conditions in operation that could result in dislodging a chuck face if it were not held in position during operation. A relatively common circumstance under which dislodging could happen occurs during unloading of finished wafers from a chuck face. In this operation a robotic wand, as described above, approaches the chuck face, fits "fingers" into grooves 27 and 29 (FIG. 2A), and by moving upward lifts a coated wafer from the chuck face, after which the wand withdraws into a load lock chamber with the coated wafer. If in this operation a wafer happens to adhere in some fashion to the chuck face, which is not typical but can occur, the action of the wand will tend to dislodge the chuck face from the hearth. It is also possible through poor adjustment for the wand to make contact with the chuck face.

Because pins 23 and 25 are mounted on surface 37 to support a wafer during processing, it is important that the chuck face not be rotatable relative to the hearth, once mounted. This registration is accomplished by a pin 24 mounted in plate 31 with a matching clearance hole in the chuck face (FIG. 2B). Locating pin 24 is shown mounted in ring 61 in the preferred embodiment with clearance hole 26 in groove 59. It will be apparent to a worker with skill in the art that the locating pin and hole may be positioned at a number of other convenient positions.

In FIG. 4A, FIG. 4B, and 4C chuck face 17 and front plate 31 are shown with centers coinciding to best illustrate corresponding diameters, clearances, and other features. This is an idealized arrangement for illustration purposes, and not necessarily true in practice. In FIG. 4B and FIG. 4C the difference in diameters is such that dimension D33 is about 0.25 mm. (about 0.010 inches). This is less then the radial difference in diameters between the angled surfaces of ring 67 and groove 53, so when a chuck face is placed on a hearth, the angled surfaces do not contact. Neither do the surfaces of the outer Rim Lock ring and groove. Rather, ID surface 95 of groove 53 rests on OD surface 97 of ring 67 at the "bottom" of the interface (FIG. 4C). Actually, the 0.25 mm. dimension D33 is common to all of the rings and grooves engaging in the preferred embodiment, except the Rim Lock ring and groove, so the chuck face does not rest on a single ring when installed.

In FIG. 4B and FIG. 4C contact between the surfaces is at the "tops" of the rings and at the "bottom" of the grooves. This is controlled by the relative height of the rings and depth of the grooves, and may be changed in other embodiments of the invention.

Another desirable effect of groove 53 and ring 67 having an angled edge is that the locking effect that occurs holds chuck face 17 at a second position in addition to the action of Rim Lock groove 71 and ring 73 at the outer periphery of the interface. This helps to avoid any warping of the chuck face that might otherwise tend to occur as a result of heating Lo a high temperature.

It has been found experimentally that for several CVD materials of interest, such as tungsten, material that forms on the surfaces away from the wafer does not begin to crack and peel until the temperature is reduced to about 200 degrees C., and does not crack and peel at temperatures above about 200 degrees C. For this reason, in an alternative preferred embodiment, the interface between chuck face 17 and front plate 31 is designed to allow interchanging of chuck faces at temperatures up to about 200 degrees C.

In this alternative embodiment, the difference is in the relative dimensions of Rim Lock groove 71 and ring 73, and in the cases where an angled groove and ring is used as described for groove 53 and ring 67 above, there is a difference as well. To allow interchanging of chuck faces at a temperature of 200 degrees C. it is necessary that D34 and D35 (FIGS. 4A and 4B) be about 0.4 mm., which is about 0.016 inches, rather than about 0.15 mm. (about 0.006 inches) as used in the embodiment for exchanging chuck faces at, "room" temperature.

When a CVD system of the sort described herein is vented to be cleaned with the chucks at well below 200 degrees C., severe flaking of extraneous coating material is often the result. By using the heaters at a reduced power while performing an exchange of chuck faces on a group of hearths in a CVD machine, the temperature of the chucks can be maintained at about 200 degrees C., flaking can be avoided, and a longer period between complete shutdown and cleaning of the chucks can be used. The result is increased uptime and throughput.

Figure 5:
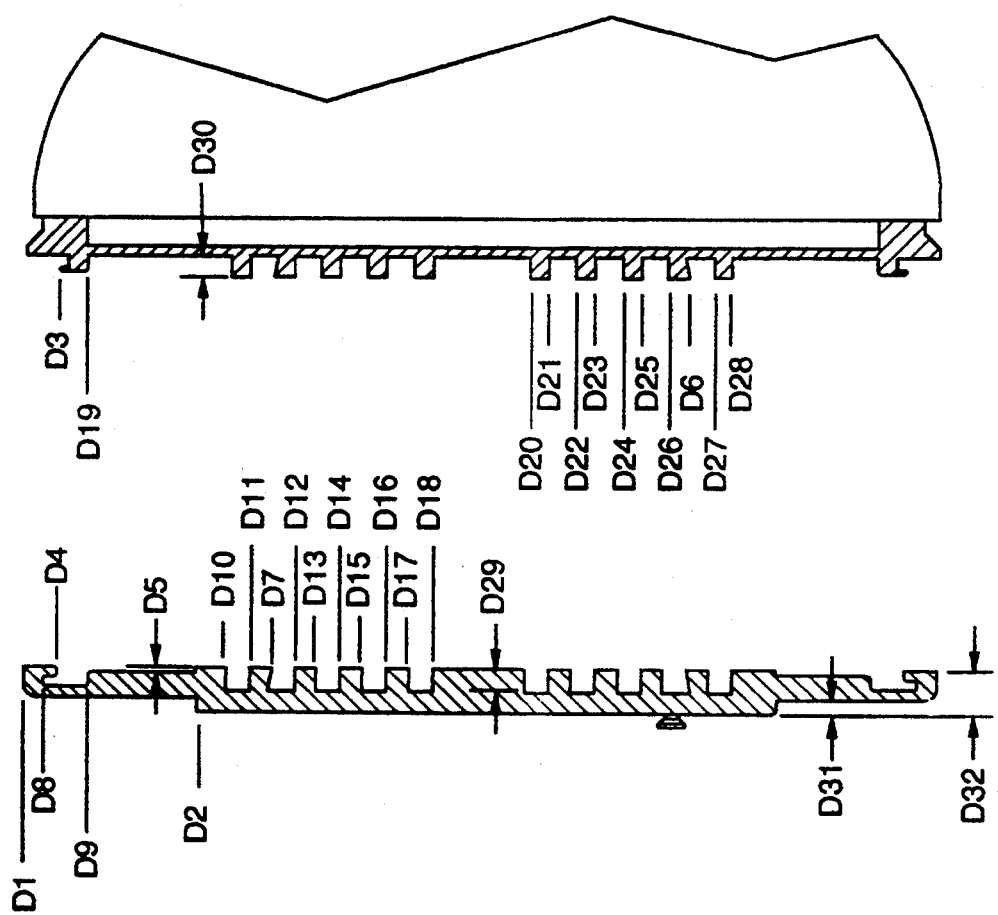
FIG. 5 is a section view of a hearth and a chuck face separated to illustrate dimensions in a preferred embodiment.

FIG. 5 is a section view of chuck face 17 and front plate 31 in the preferred embodiment described above, similar to the section of FIG. 4B, but with the chuck face and front plate 31 shown separated. In FIG. 5 diameters and other dimensions are labeled. Dimensions with a single witness line and no arrows are diameters.

FIG. 6 is a table of the diameters and dimensions in mm. of the chuck face and front plate shown in FIG. 5 at "room" temperature of about 20 degrees C. It will be apparent to a worker with skill in the art that there are many changes that may be made in these dimensions, in the number and placement of grooves and rings, and in other dimensions and features, without departing from the spirit and scope of the present invention. The dimensions provided in FIG. 6 are for a graphite chuck face and a monel metal hearth as described in detail above, and are exemplary of one set of dimensions within the scope of the present invention. In the set of dimensions given, the Rim Lock groove and ring lock together at about 100 degrees C.

Figure 7:
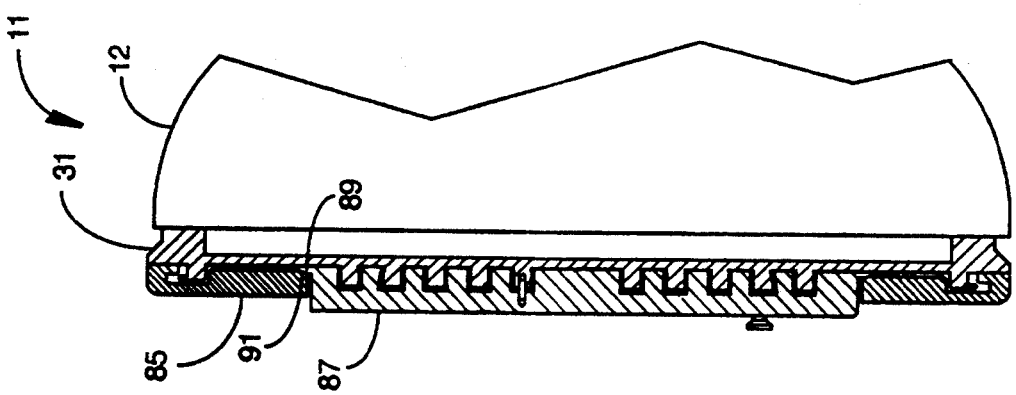
FIG. 7 is a side elevation section view of a preferred embodiment with a separate apron portion and insert portion.

FIG. 7 is a section view similar to FIG. 2B showing an alternative embodiment of the present invention wherein the chuck face comprises two pieces, an apron portion 85 and an insert portion 87. In this embodiment the apron portion can be interchanged without changing the central portion, which is typically covered by a wafer, and does not get as much extraneous coating as the apron portion.

In this embodiment there is a possibility of making apron portion 85 discardable. The basic dimensions for diameters, groove depths, and so forth, are about the same in this embodiment as for the first described embodiment above. A radial projection 89 is made to underlie the apron portion which has an accommodating radial opening 91.

It will be apparent to one with skill in the art that there are many alterations that might be made in details of the present invention without departing from the spirit and scope of the invention. For example, there may be more than the five grooves and matching rings described, or there may be none. Five have proven in practice to be adequate for processes of immediate interest, but in some embodiments fewer may be adequate or more may be needed. Also, the depth of the grooves may also vary.

It is not strictly required in the invention that the engaging and interlocking element be rings and grooves as described in the preferred embodiment. The ring and groove embodiment is convenient and relatively inexpensive to machine compared to some other arrangements. In other embodiments, "bayonet" projections have been provided on one of the hearth and chuck face, having machined heads engaging in holes or grooves such that thermal expansion of the head of the "bayonet" projection engages the groove so the chuck face may not be removed. There are similarly many other ways that geometric projections from one of the surfaces may be designed to engage receptor elements in the other such that thermal expansion of the two dissimilar materials will cause the chuck face and the hearth surface to be securely engaged at operating temperature while "loose" at temperatures desired for interchanging chuck faces on the hearths. Such differences are considered by the inventors to be design alterations and well within the spirit and scope of the invention.

There are other materials that might be used, such as ceramics or even quartz, for the chuck face. There are many grades of graphite as well that would be suitable. The angled side of one groove and matching ring as described is convenient, and accomplishes a desired end, but is not essential to the working of the invention. There are similarly many other alterations that might be made without departing from the spirit and scope of the invention.

What is claimed is:

1. A chuck for holding a substrate during CVD processing in a CVD chamber comprising:
a support positioned within said CVD chamber and comprising a mounting surface having a first interlocking element;
a heater associated with said support for heating said substrate; and
an interchangeable chuck face for providing an interchangeable surface for said chuck, said interchangeable chuck face having a first surface for supporting said substrate and a second surface opposite said first surface for mounting to said mounting surface, said second surface comprising a second interlocking element for engaging said first interlocking element;
said interlocking elements operable by temperature change to capture and release said interchangeable chuck face.

2. A chuck as in claim 1 wherein said interlocking elements comprise a projecting element from one of said second surface and said mounting surface and an opening in the other of said second surface and said mounting surface, said projecting element insertable into and removable from said opening at and below a selected temperature T1, and not insertable into or removable from said opening at a selected temperature T2 higher than temperature T1.

3. A chuck as in claim 2 wherein said projecting element is a projecting circular ring having a radially extending rim, and said opening is a circular groove having a radially extending undercut, said projecting circular ring insertable into and removable from said circular groove at temperature T1, and said radially extending rim engaging said radially extending undercut at selected temperature T2 and higher temperatures than temperature T2, securing said interchangeable chuck face on said mounting surface of said support.

4. A chuck as in claim 2 wherein said projecting element comprises a projecting circular ring having an increasing outer diameter in the direction of said projection for a portion of said projection, and said opening comprises a circular groove having an increasing outer diameter in the direction of the depth of said groove for a portion of said depth, the maximum outer diameter of said ring being smaller than the minimum outer diameter of said groove at and below a selected temperature T1 for said mounting surface in operation, and larger than the minimum outer diameter of said groove at a selected temperature T2 higher than temperature T1.

5. A chuck as in claim 3 further comprising multiple concentric, non-interlocking rings and grooves on said mounting surface and said second surface, said multiple, non-interlocking rings and grooves configured to engage with said chuck face mounted to said mounting surface.

6. A chuck as in claim 4 further comprising multiple concentric, non-interlocking rings and grooves on said mounting surface and said second surface, said multiple rings and grooves configured to engage with said chuck face mounted to said mounting surface.

7. A chuck as in claim 1 wherein said interchangeable chuck face is constructed substantially of graphite.

8. A system for CVD processing comprising:
an exhaustible CVD chamber for enclosing the process;
gas supply apparatus for supplying processing gases to said CVD chamber; and
a chuck within said CVD chamber for holding a substrate during said CVD processing, said chuck comprising:
a support positioned within said CVD chamber and comprising a mounting surface having a first interlocking element;
a heater associated with said support for heating said substrate; and
an interchangeable chuck face for providing an interchangeable surface for said chuck, said interchangeable chuck face having a first surface for supporting said substrate and a second surface opposite said first surface for mounting to said mounting surface, said second surface comprising a second interlocking element for engaging said first interlocking element;
said interlocking elements operable by temperature change to capture and release said interchangeable chuck face.

9. A system as in claim 8 wherein said interlocking elements comprise a projecting element from one of said second surface and said mounting surface and an opening in the other of said second surface and said mounting surface, said projecting element insertable into and removable from said opening at and below a selected temperature T1, and not insertable into or removable from said opening at a selected temperature T2 higher than temperature T1.

10. A system as in claim 9 wherein said projecting element is a projecting circular ring having a radially extending rim, and said opening is a circular groove having a radially extending undercut, said projecting circular ring insertable into and removable from said circular groove at temperature T1, and said radially extending rim engaging said radially extending undercut at selected temperature T2 and higher temperatures than temperature T2, securing said interchangeable chuck face on said mounting surface of said support.

11. A system as in claim 9 wherein said projecting element comprises a projecting circular ring having an increasing outer diameter in the direction of said projection for a portion of said projection, and said opening comprises a circular groove having an increasing outer diameter in the direction of the depth of said groove for a portion of said depth, the maximum outer diameter of said ring being smaller than the minimum outer diameter of said groove at and below a selected temperature T1 for said mounting surface in operation, and larger than the minimum outer diameter of said groove at a selected temperature T2 higher than temperature T1.

12. A system as in claim 10 further comprising multiple concentric, non-interlocking rings and grooves on said mounting surface and said second surface, said multiple, non-interlocking rings and grooves configured to engage with said chuck face mounted to said mounting surface.

13. A system as in claim 11 further comprising multiple concentric, non-interlocking rings and grooves on said mounting surface and said second surface, said multiple rings and grooves configured to engage with said chuck face mounted to said mounting surface.

14. A system as in claim 8 wherein said interchangeable chuck face is constructed substantially of graphite.

15. A system as in claim 8 further comprising art air lock and robotic transfer apparatus for loading and tinloading substrates.

16. An interchangeable chuck face for facilitating removal of extraneous coating in a CVD system having a sealable chamber and a support within the chamber for supporting a substrate to be coated, said chuck face comprising:
- a first side configured for holding a wafer to be coated; and
- a second side opposite said first side, said second side comprising a capturing element for securing said second side to a mounting surface of said support securely during operation, said capturing element operable by temperature change to capture said chuck face on said mounting surface and to release said chuck face for removal from said mounting surface.

17. An interchangeable chuck face as in claim 16 wherein said capturing element comprises one of a projecting capture ring on or circular capture groove in said second side, engageable in a matching capture ring or capture groove on said mounting surface.

18. An interchangeable chuck face as in claim 17 wherein said capture ring or capture groove has a tapered side for matching a tapered side of a corresponding capture ring or capture groove on said mounting surface.

19. An interchangeable chuck face as in claim 17 further comprising concentric non-capturing grooves in said second side for engaging matching non-capturing rings on said mounting surface.

20. An interchangeable chuck face as in claim 18 further comprising concentric non-capturing grooves in said second side for engaging matching non-capturing rings on said mounting surface.

* * * * *